United States Patent
Miyaji

(10) Patent No.: US 7,239,068 B2
(45) Date of Patent: Jul. 3, 2007

(54) METHOD FOR MOUNTING SURFACE ACOUSTIC WAVE ELEMENT AND SURFACE ACOUSTIC WAVE DEVICE HAVING RESIN-SEALED SURFACE ACOUSTIC WAVE ELEMENT

(75) Inventor: Naomi Miyaji, Aomori (JP)

(73) Assignee: Fujitsu Media Devices Limited, Yokohama (JP)

( * ) Notice: Subject to any disclaimer, the term of this patent is extended or adjusted under 35 U.S.C. 154(b) by 0 days.

(21) Appl. No.: 10/934,414

(22) Filed: Sep. 7, 2004

(65) Prior Publication Data

US 2005/0029906 A1    Feb. 10, 2005

(30) Foreign Application Priority Data

Mar. 29, 2002    (JP)    ............... 2002-093947

(51) Int. Cl.
*H01L 41/053*    (2006.01)

(52) U.S. Cl. .................. 310/340; 310/344; 310/348

(58) Field of Classification Search ............... 310/344, 310/348, 340; 29/25.35
See application file for complete search history.

(56) References Cited

U.S. PATENT DOCUMENTS

| | | | | |
|---|---|---|---|---|
| 3,924,737 | A * | 12/1975 | Ernst et al. | 206/524.5 |
| 4,569,880 | A * | 2/1986 | Nishiyama et al. | 428/212 |
| 5,989,940 | A * | 11/1999 | Nakajima | 438/127 |
| 6,262,513 | B1 * | 7/2001 | Furukawa et al. | 310/313 R |
| 6,329,739 | B1 * | 12/2001 | Sawano | 310/313 R |
| 6,379,997 | B1 * | 4/2002 | Kawahara et al. | 438/106 |
| 6,516,503 | B1 * | 2/2003 | Ikada et al. | 29/25.35 |
| 6,663,943 | B2 * | 12/2003 | Kadota | 438/156 |
| 2002/0090162 | A1 * | 7/2002 | Asada et al. | 385/14 |
| 2004/0026361 | A1 * | 2/2004 | Namba et al. | 216/13 |
| 2005/0006987 | A1 * | 1/2005 | Masuko et al. | 310/344 |

FOREIGN PATENT DOCUMENTS

| | | | | |
|---|---|---|---|---|
| DE | 3138743 A1 * | 4/1983 | | 310/344 |
| EP | 0 939 485 | 9/1999 | | |
| GB | 2 297 424 | 7/1996 | | |
| JP | 03-041146 | * 2/1991 | | |
| JP | 06-204293 | 7/1994 | | |
| JP | 8-204497 | 8/1996 | | |
| JP | 9-330951 A | * 12/1997 | | |
| JP | 10-321666 | 12/1998 | | |
| JP | 11-017490 | 1/1999 | | |
| JP | 11-150440 | * 6/1999 | | |
| JP | 11-214955 | 8/1999 | | |
| JP | 11-251866 | 9/1999 | | |
| JP | 2001-168220 | 6/2001 | | |

* cited by examiner

*Primary Examiner*—Thomas M. Dougherty
(74) *Attorney, Agent, or Firm*—Arent Fox LLP

(57) ABSTRACT

A surface acoustic wave device that enables to reduce heating process, prevent from heat break, and make thin profile is to be provided. The surface acoustic wave device includes a substrate, a surface acoustic wave element having a comb electrode formed on a piezoelectric substrate, and being flip-mounted on the substrate using a bump in such a manner as the comb electrode is disposed opposite to the substrate, a first resin layer covering the surface acoustic wave element, and a second resin layer formed on the first resin layer, wherein the first resin layer and the second resin layer are thermosetting resins in which state transitions of being softened and thereafter cured are produced through heating process, and the first resin layer is formed of a resin material having greater fluidity caused by softening than the resin material of the second resin layer.

5 Claims, 6 Drawing Sheets

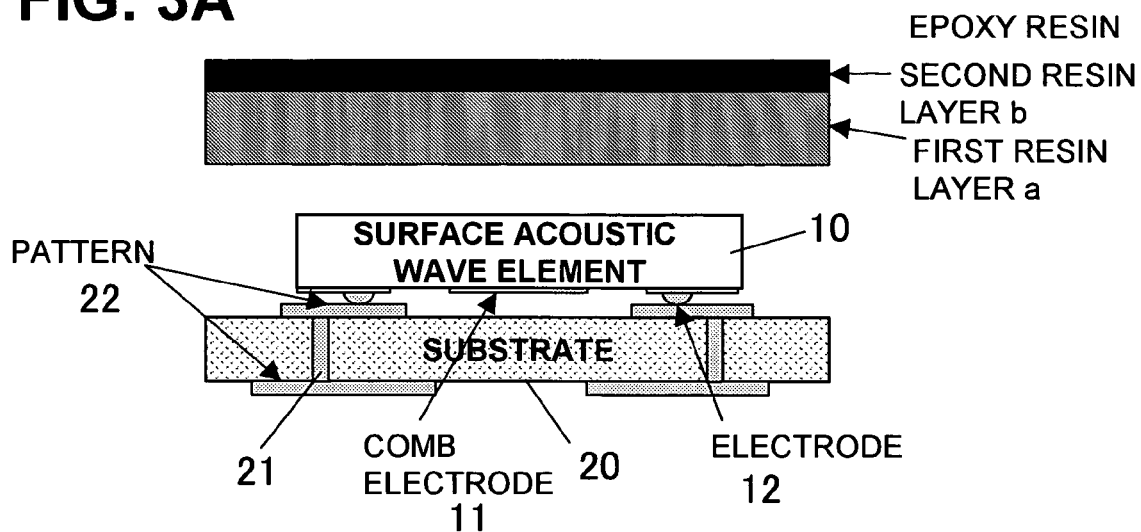
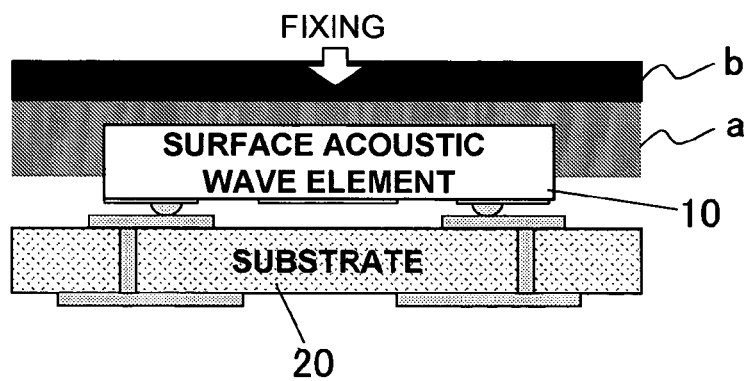
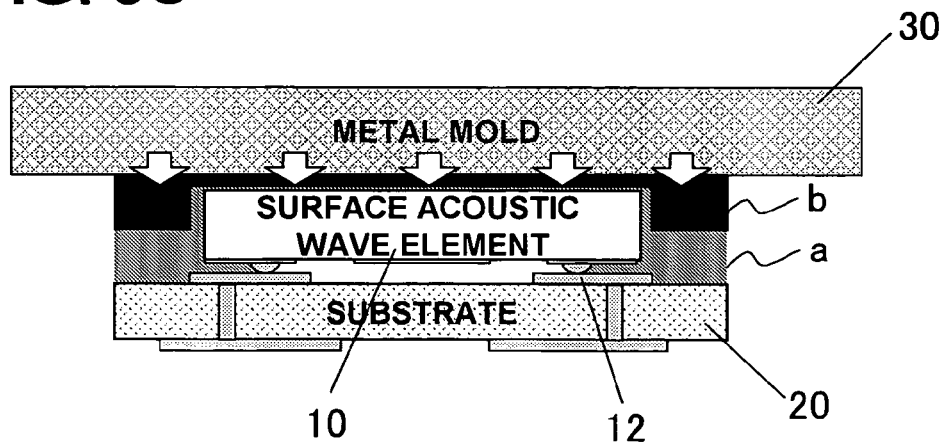

METHOD FOR MOUNTING SURFACE ACOUSTIC WAVE ELEMENT AND SURFACE ACOUSTIC WAVE DEVICE HAVING RESIN-SEALED SURFACE ACOUSTIC WAVE ELEMENT

FIELD OF THE INVENTION

The present invention relates to a method for mounting a surface acoustic wave element, and a surface acoustic wave device using the same.

BACKGROUND OF THE INVENTION

The surface acoustic wave device includes the surface acoustic wave element having comb electrodes formed on the surface of a piezoelectric substrate, and has an electric characteristic fit for a resonant circuit or a filter by a surface acoustic wave propagating between the comb electrodes.

Therefore, when enclosing the surface acoustic wave element in the surface acoustic wave device, space is necessary at least above the surface of the piezoelectric substrate on which the comb electrodes of the surface acoustic wave element are formed.

Further, if dust, moisture or the like is attached to the comb electrodes, propagation characteristic of the surface acoustic wave is varied. To prevent this, it is desired that the room above the surface on which the comb electrode is formed is airtight sealed.

One method to satisfy the above requirement, a technique has been disclosed in the official gazette of the Japanese Unexamined Patent Publication No. 2000-124767 (hereafter referred to as prior art.) In this prior art, a bump is employed for connecting the substrate with the surface acoustic wave element (chip), and sealing walls are formed on both inside and outside the bump.

On examination of this configuration, an area is required to form the inside wall between the comb electrode and the bump, which becomes disadvantageous to the miniaturization of the surface acoustic wave element.

Further, the surface of the surface acoustic wave element facing the opposite side to the substrate is bare, which lacks reliability. To solve this problem, in the embodiment of the prior art, the surface acoustic wave element is sealed inside the bottom of a sealing case, using the aforementioned double wall structure. Further, this sealing case is mounted on the substrate in the state that the surface acoustic wave element faces upward.

However, with the above configuration, the surface acoustic wave device becomes inevitably large in size because of the sealing case.

Considering this point, the inventor of the present invention has proposed a structure of the surface acoustic wave device, which includes a surface acoustic wave element, having a substrate and a comb electrode formed on a piezoelectric substrate, flip-mounted on the substrate with a bump in a state such that the comb electrode faces the substrate; a first resin layer formed in the surrounding area of the bumps of the surface acoustic wave element; and a second resin layer covering the first resin layer and at least the side faces of the surface acoustic wave element (the Japanese Patent Application No. 2000-29880.)

In regard to this surface acoustic wave device, a cross-section structure and an exemplary manufacturing process are shown in FIGS. 1 and 2, respectively. As shown in FIG. 1, a surface acoustic wave element 10 (shown as C) having a comb electrode 11 formed on a piezoelectric substrate, and a substrate 20 (shown as B) having electrode patterns on both faces via a through hole 21 are prepared. Next, according to the process shown in FIG. 2, surface acoustic wave element 10 is chip bonded onto substrate 20 with a pad electrode 12, so that the face on which comb electrode 11 is formed is disposed opposite to substrate 20 (process P1).

Next, resin material forming a first resin layer (a) coats a pad electrode 12, an electrode pattern 22 and the side faces of surface acoustic wave element 10 using a dispenser, etc (process P2). Here, as the resin material forming the first resin layer (a), a liquid resin having a high viscosity is employed so as not to flow inside pad electrode 12.

Next, drying process follows for 15–30 minutes at 125–150° C. (process P3). After the drying, resin material of the second resin layer (b) having higher viscosity than the resin material of the first resin layer (a) is transfer molded, and one face of substrate 1 including surface acoustic wave element 10 is sealed, followed by heat curing the resin (process P4). The heating conditions at this time are, for example, for 3–5 minutes at 150–175° C.

Further, as a post cure, heat is added for 60–180 minutes at 150–175° C. (process P5).

Here, although not shown in FIG. 1, it is possible to form a plurality of surface acoustic wave devices at a time by chip bonding a plurality of surface acoustic wave elements 10 on a single substrate in the above process P1 and thereafter performing the above processes P2 to P4. In this case, the plurality of surf ace acoustic wave devices are cut into separated pieces by dicing (process P6). Thereafter, a characteristic test is performed for each surface acoustic wave device (process P7), and pieces having satisfactory quality is selected, packed and shipped (process P8).

According to the above-mentioned method having been proposed by the inventor of the present invention, a small-sized surface acoustic wave-device having a thin profile can be attained by adopting the structure of surf ace acoustic wave element 10 bonded on substrate 20. However, resin sealing by heating must be performed twice, which may cause a problem of the thermal stress received by the piezoelectric substrate forming surface acoustic wave element 10 becomes twofold.

DISCLOSURE OF THE INVENTION

Accordingly, it is an object of the present invention to provide a method for mounting a surface acoustic wave element and a surface acoustic wave device using the same, which solve the above-mentioned problem of receiving twofold thermal stress according to the prior art proposed by the inventor of the present invention.

As a first aspect of the surface acoustic wave device according to the present invention to attain the aforementioned object, the surface acoustic wave device includes a substrate; a surface acoustic wave element having a comb electrode formed on a piezoelectric substrate, and being flip-mounted on the substrate using a bump in such a manner as the comb electrode is disposed opposite to the substrate; and a first resin layer covering the surface acoustic wave element and a second resin layer formed on the first resin layer. The first resin layer and the second resin layer are thermosetting resins that are cured after softened in heating process. The first resin layer is formed of resin material having greater fluidity caused by softening than the resin material of the second resin layer.

As a second aspect of the surface acoustic wave device according to the present invention to attain the aforementioned object, the surface acoustic wave device in the first aspect has the first resin layer constituted of resin material having higher curing temperature than the resin material of the second resin layer.

As a third aspect of the surface acoustic wave device according to the present invention, the surface acoustic wave device in the first aspect has the second resin layer which has a mold releasing agent added thereto, and the second resin layer is separated after the state transitions in the first resin layer of being softened and thereafter cured are produced.

As a fourth aspect of the surface acoustic wave device according to the present invention to attain the aforementioned object, the surface acoustic wave device includes an individual surface acoustic wave element being cut out of a plurality of surface acoustic wave elements, each having a comb electrode formed on a piezoelectric substrate and being flip-mounted on a single common substrate using a bump in such a manner as the comb electrode is disposed opposite to the common substrate. In a state of being mounted on the common substrate, the plurality of surface acoustic wave elements are covered by a first resin layer, and a second resin layer formed on the first resin layer. The first resin layer and the second resin layer are thermosetting resins in which state transitions of being softened and thereafter cured are produced through heating process, and the first resin layer is formed of a resin material having a greater fluidity caused by softening than the resin material of the second resin layer.

As a fifth aspect of the surface acoustic wave device according to the present invention, the surface acoustic wave device includes a substrate; a surface acoustic wave element having a comb electrode formed on a piezoelectric substrate, and being flip-mounted on the substrate using a bump in such a manner as the comb electrode is disposed opposite to the substrate a heat-resistant laminating frame laminated on the substrate, and positioned so as to surround the surface acoustic wave element; and a resin layer for covering the surface acoustic wave element. The resin layer is a thermosetting resin in which state transitions of being softened and thereafter cured are produced through heating process, and the resin layer seals the comb electrode by adhering to the side faces of the surface acoustic wave element and the upper face of the laminating frame.

As a sixth aspect of the surface acoustic wave device according to the present invention, in the fifth aspect, at least a portion of the upper face of the laminating frame is metalized.

As a seventh aspect of the surface acoustic wave device according to the present invention, in the fifth aspect, either a glass coat or a metal coat is formed on the upper face of the laminating frame and the upper face of the surface acoustic wave element.

As a mounting method of the surface acoustic wave element according to the present invention, the method includes: flip-mounting, on a substrate, the surface acoustic wave element having a comb electrode formed on a piezoelectric substrate using a bump in such a manner as the comb electrode is disposed opposite to the substrate; fixing a resin sheet formed of a first resin layer of thermosetting resin, in which state transitions of being softened and thereafter cured are produced through heating process, and a second resin layer formed on the first resin layer, in which the first resin layer is formed of a resin material having a greater fluidity caused by softening than the resin material of the second resin layer; and airtight sealing the comb electrode by pressing the resin sheet with heat at a predetermined temperature.

Further scopes and features of the present invention will become more apparent by the following description of the embodiments with the accompanying drawings.

BRIEF DESCRIPTION OF THE DRAWINGS

FIG. 3 shows a cross section structure illustrating the first embodiment of the surface acoustic wave device according to the present invention.

THE PREFERRED EMBODIMENTS OF THE INVENTION

FIG. 3 shows a diagram of a cross section structure illustrating a first embodiment of a surface acoustic wave device according to the present invention. Mounting process of a surface acoustic wave element 10 is shown on the order of FIGS. 3A to 3C.

Figure 1:
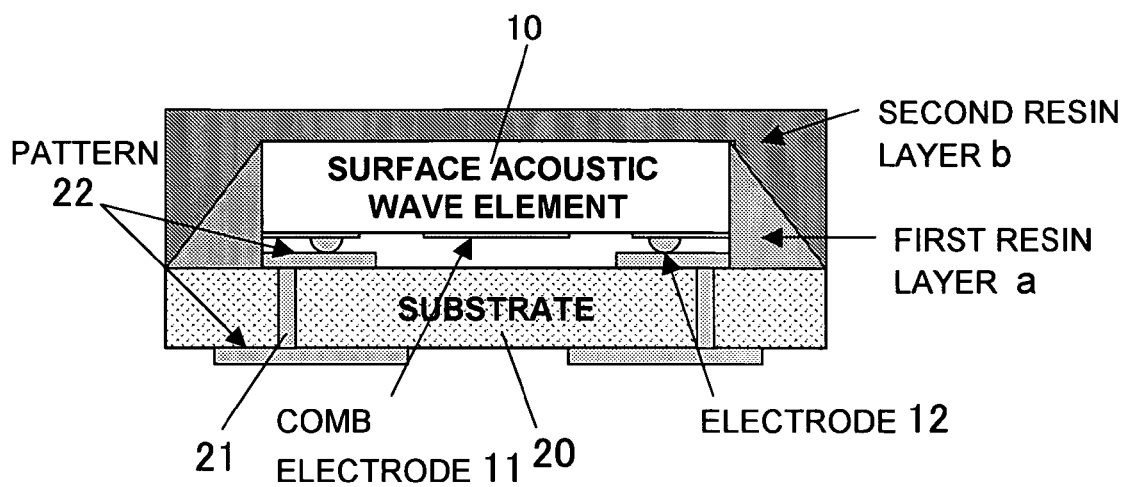
FIG. 1 shows a diagram illustrating a cross section structure of the surface acoustic wave device.
Figure 2:
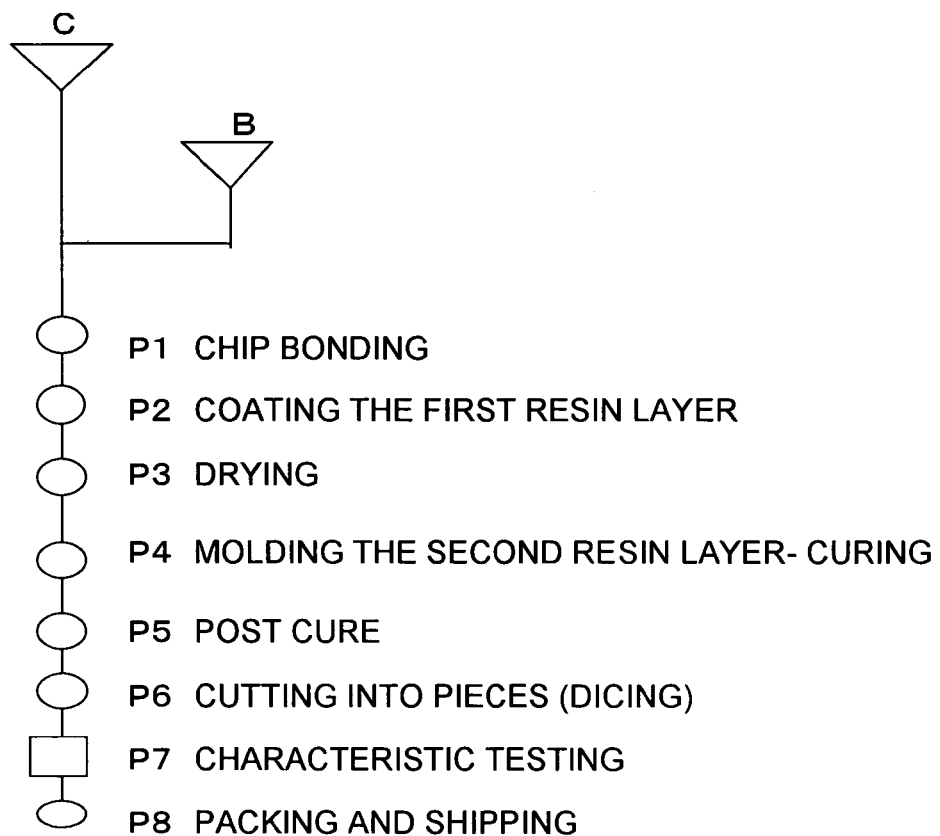
FIG. 2 shows a diagram illustrating an exemplary manufacturing process of the surface acoustic wave device shown in FIG. 1.

In FIG. 3A, surface acoustic wave element 10 constituted of a comb electrode 11 formed on a piezoelectric substrate, and a substrate 20 having electrode patterns on both faces via a through hole 21. Similar to the process P1 shown in FIG. 2, surface acoustic wave element 10 is chip bonded onto substrate 20 in such a state that the face having comb electrode 11 formed thereon with pad electrode 12 is disposed opposite to substrate 20.

Further, an epoxy resin sheet of thermosetting resin having a double layer structure including a first resin layer (a) and a second resin layer (b) having a different thermal fluidity from the first resin layer (a) are prepared.

As an exemplary embodiment, substrate 20 is 200 μm thick and surface acoustic wave element 10 is 250 μm thick. The thickness of the first resin layer (a) is 300 μm, and the thickness of the second resin layer (b) is on the order of 100 μm.

Further, in heating process, the first resin layer (a) has a property of greater thermal fluidity than the second resin layer (b), resulting in that the first resin layer (a) is softened earlier than the second resin layer (b).

As shown in FIG. 3B, the epoxy resin sheet constituted of the first resin layer (a) and the second resin layer (b) is fixed onto surface acoustic wave element 10 by use of a heating roller.

At this time, as shown in FIG. 3B, the first resin layer (a) hangs down caused by the first resin layer (a) becoming fluid, so that the first resin layer (a) covers the side faces of surface acoustic wave element 10.

Further, heat is added for 10 minutes at a temperature of 150° C. while keeping on a pressure of 100 kg/5 cm² by use of a mold metal fitting 30 having a sufficient thermal conductivity. At this time, the second resin layer (b) is also softened as well as the first resin layer (a), resulting in pressing the first resin layer (a). With this, the first resin layer (a) contacts to substrate 20, and covers up to pad electrodes 12. In addition, at this time, the fluidity of the first resin layer (a) is selected to such an extent that the resin does not invade into the gap between substrate 20 and surface acoustic wave element 10.

Thereafter, mold metal fitting 30 is removed, and post quenching is performed for three (3) hours at 150° C. With this quenching, both the first resin layer (a) and the second resin layer (b) are cured, and airtight sealing is achieved with the space maintained above comb electrode 11 of surface acoustic wave element 10.

According to the embodiment of the present invention shown in FIG. 3, by sealing with a resin sheet constituted of the first resin layer (a) and the second resin layer (b), it becomes possible to restrict the number of stress added against surface acoustic wave element 10 by heating only once. Thus, it becomes possible to increase the reliability of the surface acoustic wave device.

Hereafter, the first resin layer (a) and the second resin layer (b) constituting the resin sheet in the embodiment of the present invention will be discussed.

As is apparent from the above description of the embodiment, both the first resin layer (a) and the second resin layer (b) are formed of bisphenol epoxy resin, which has a property of once being shifted into a softened state by heating, and thereafter being cured by heating further.

As a prerequisite for the embodiment of the present invention shown in FIG. 3, the first resin layer (a) has a greater decrease in viscosity caused by heating than that of the second resin layer (b). In other words, the first resin layer (a) has a greater thermal fluidity. This thermal fluidity is controllable, for example, by adjusting an added amount of inorganic filler.

Figure 4:
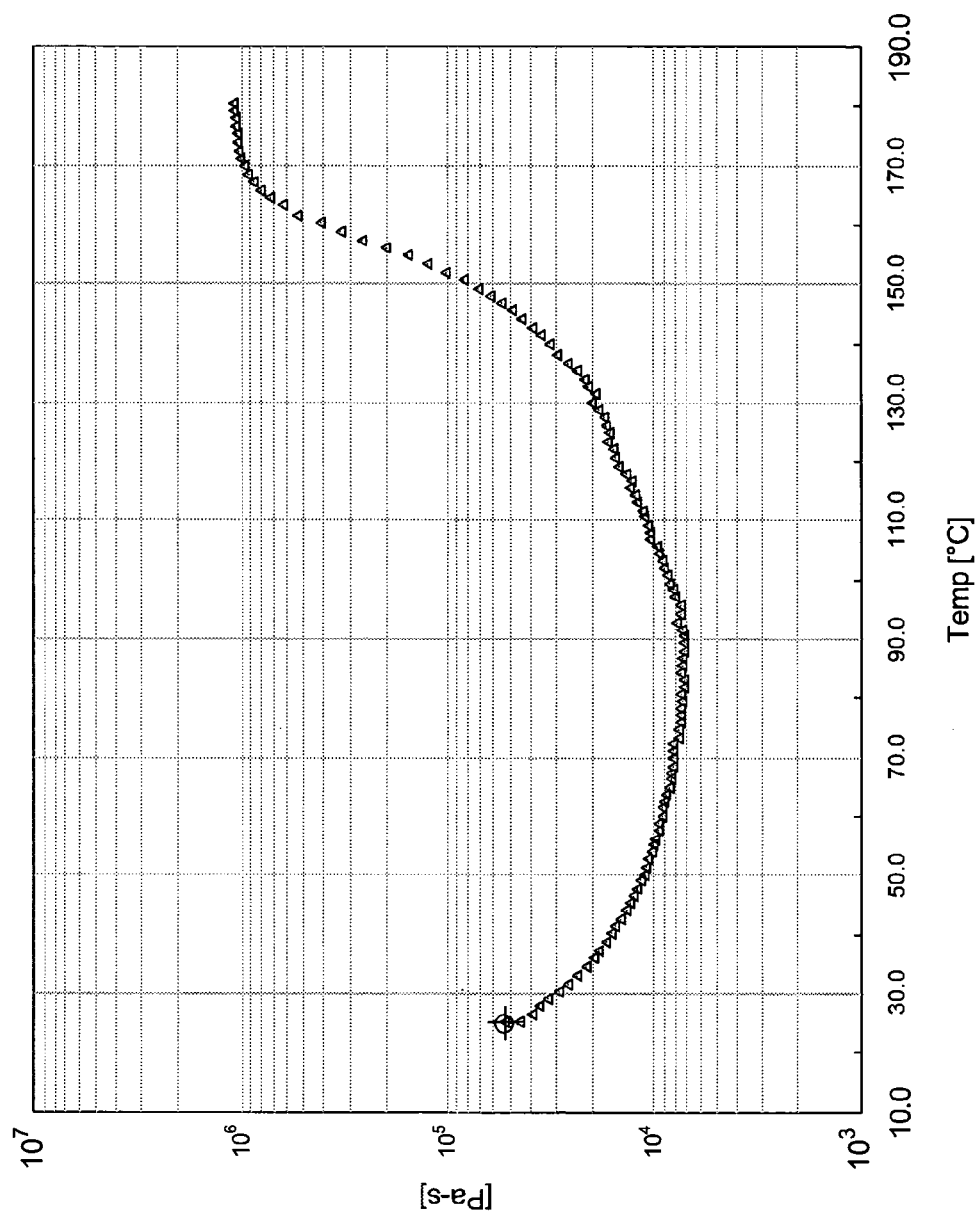
FIG. 4 shows an example of a variation characteristic of viscosity (Pa-s: vertical axis) versus temperature (° C.: horizontal axis) in regard to a first resin layer (a).
Figure 5:
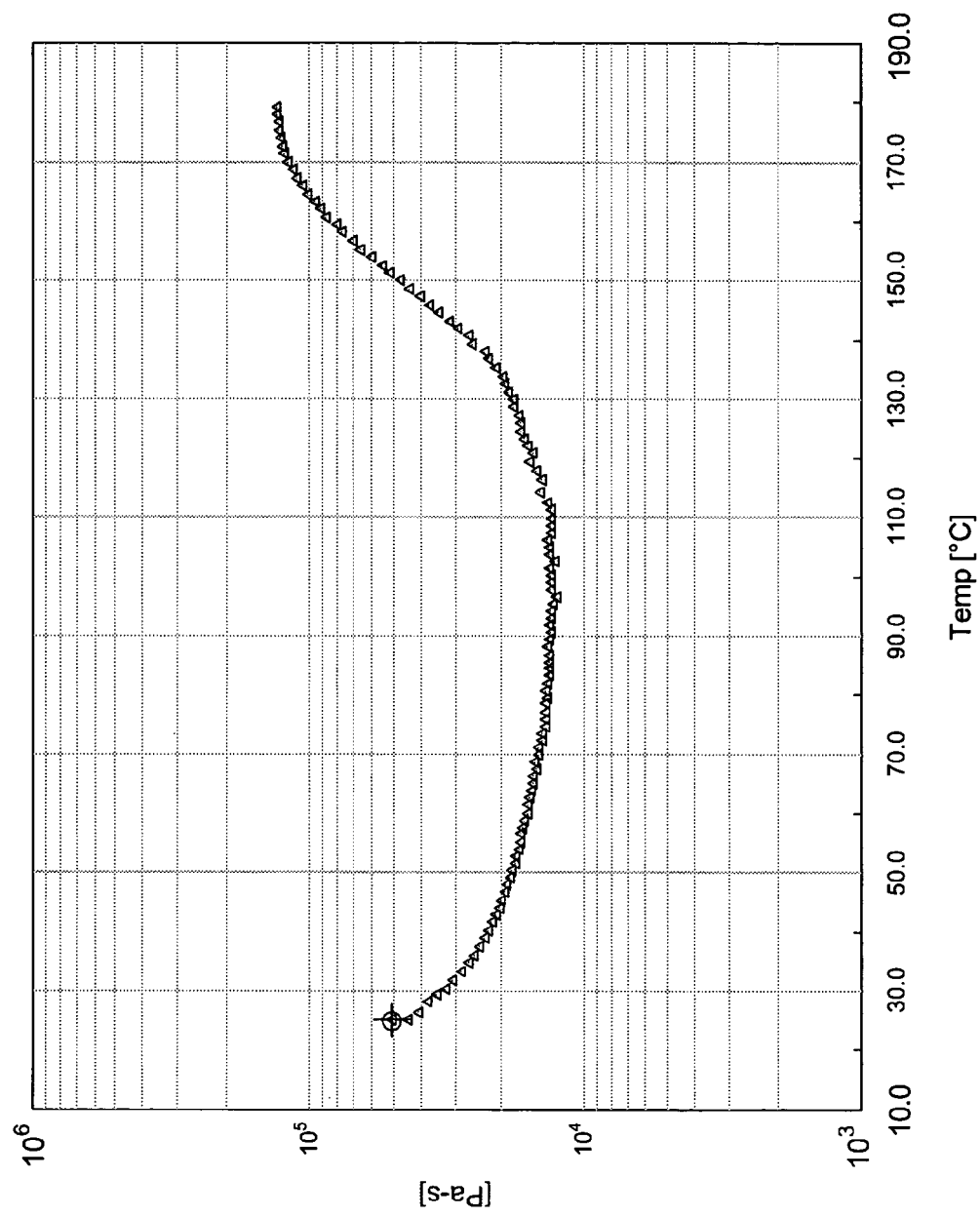
FIG. 5 shows an example of a variation characteristic of viscosity (Pa-s: vertical axis) versus temperature (° C.: horizontal axis) in regard to a second resin layer (b).

FIGS. 4 and 5 show diagrams illustrating exemplary variation characteristics of viscosity (Pa-s: vertical axis) versus temperature (° C.: horizontal axis) with regard to the first resin layer (a) and the second resin layer (b), respectively. In comparison of the characteristic of the first resin layer (a) shown in FIG. 4 with the characteristic of the second resin layer (b) shown in FIG. 5, in both cases, the viscosity decreases with an increase of temperature. However, in a range of temperatures from 50° C. to 110° C., the viscosity of the first resin layer (a) is lower than the viscosity of the second resin layer (b), and therefore the first resin layer (a) becomes easy to flow. Namely, it is understood that the first resin layer (a) has a greater fluidity than the second resin layer (b).

Also, in both cases, the viscosity becomes greater at 110° C. or more, and thereafter, at 150° C., the viscosity reaches substantially the same value as that in the ordinary temperature before the heating.

As such, using the feature of the first resin layer (a) having a greater fluidity than the second resin layer (b), the above embodiment shown in FIG. 3 in accordance with the present invention can be actualized.

Figure 6:
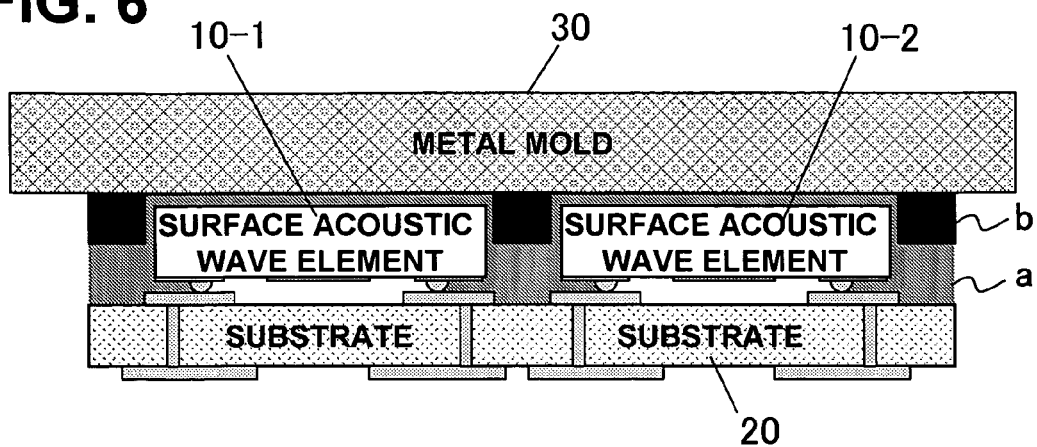
FIG. 6 shows a diagram illustrating a second embodiment of the present invention.

FIG. 6 shows a diagram illustrating a second embodiment of the present invention. A plurality of surface acoustic wave elements 10-1, 10-2 are mounted with chip bonding on substrate 20 in a similar manner to FIG. 3A. The resin sheet constituted of the first resin layer (a) and the second resin layer (b) are fixed thereon. The resin sheet is then pressed with heat by use of mold metal fitting 30. Thus, the similar state to that shown in FIG. 3C is obtained.

Next, by separating into individual pieces using a non-illustrated dicing cutter, a plurality of surface acoustic wave devices are obtained. A thin profile and airtight sealing are actualized in the separated individual surface acoustic wave devices.

Figure 7A:
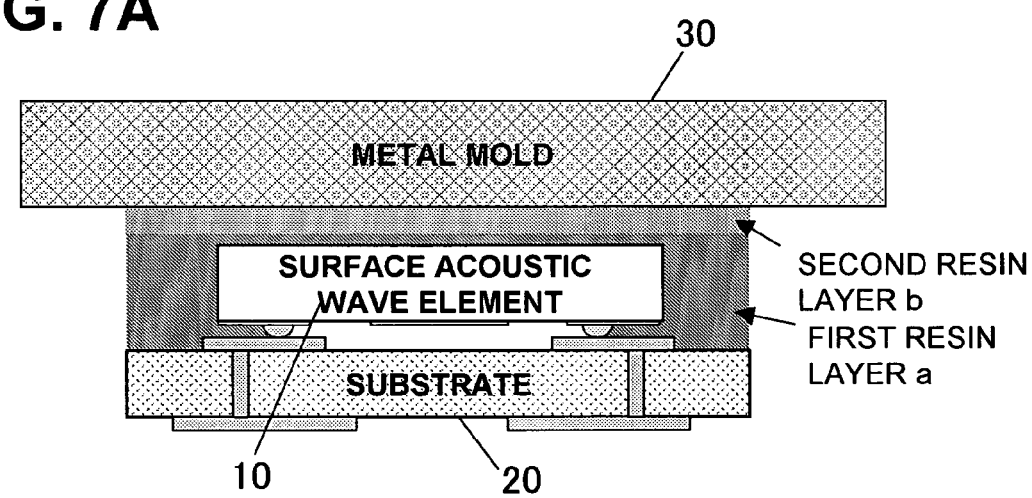
FIG. 7 shows a diagram illustrating a third embodiment of the present invention.
Figure 7B:
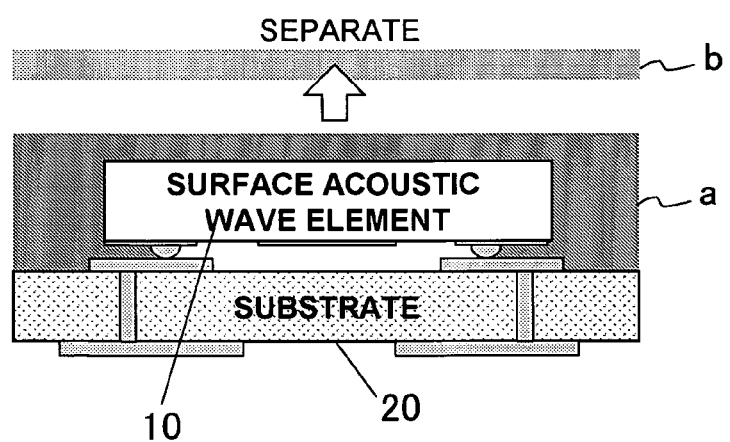

FIG. 7 shows a third embodiment of the present invention. A feature of this embodiment is that a mold releasing agent such as wax is added to the second resin layer (b). As shown in FIG. 7A, heat and pressure are added by use of mold metal fitting 30. Thus, the first resin layer (a) becomes fluid, producing such a state that the side faces of surface acoustic wave element 10 are covered. Next, by removing mold metal fitting 30 as shown in FIG. 7B, the second resin layer (b) having the mold releasing agent added thereto can easily be separated from the first resin layer (a), and a thin profile of the surface acoustic wave device can be obtained.

In this embodiment, the second resin layer (b) mainly acts as heat buffer material against the first resin layer (a). Namely, when heating the first resin layer (a) directly using mold metal fitting 30, both the velocity and degree of fluidization become greater, making it difficult to seal the surface acoustic wave element in a preferred manner.

On the other hand, when heating through the second resin layer (b) acting as heat buffer material, it is possible to heat the first resin layer (a) gradually. For this reason, it is preferable that the difference in the viscosity between the first resin layer (a) and the second resin layer (b) used in the embodiment shown in FIG. 7 is greater than the viscosity difference therebetween in the embodiment shown in FIG. 3.

FIG. 8 shows diagrams of still other embodiments of the present invention. In each of these embodiments, an example in which only the first resin layer (a) is used is shown.

Figure 8A:
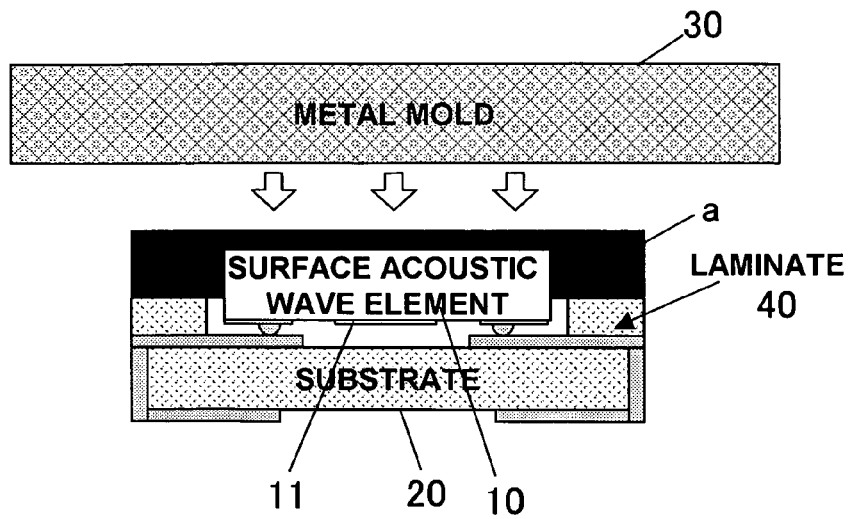
FIG. 8 shows a diagram illustrating still further embodiments of the present invention.

In FIG. 8A, a laminating frame 40 is formed in advance on the periphery of surface acoustic wave element 10 being mounted on substrate 20 with bonding. In this state, similar to the preceding embodiments, the first resin layer (a) is fixed onto surface acoustic wave element 10, and then pressed with heat using mold metal fitting 30.

With this, the first resin layer (a) becomes fluid, and covers both the upper face of laminating frame 40 the side faces of surface acoustic wave element 10, and thus airtight sealing of comb electrode 11 can be attained.

Figure 8B:
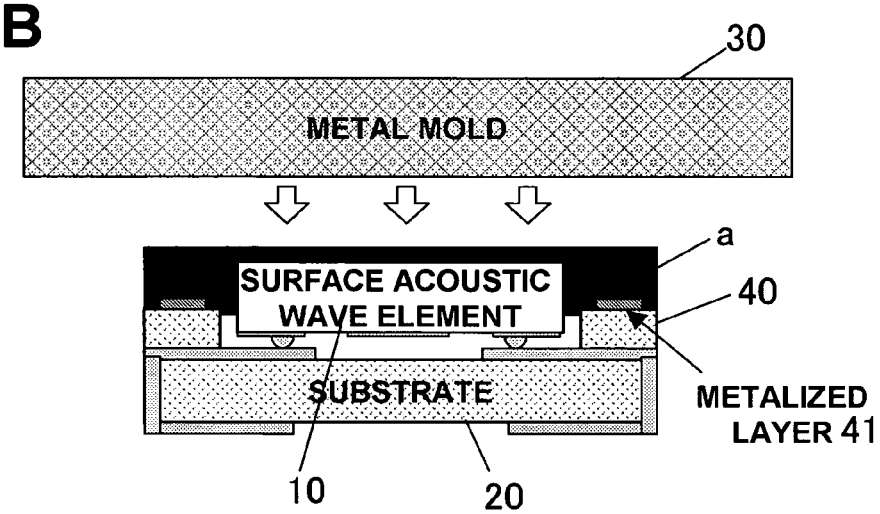

FIG. 8B shows an example in which the embodiment shown in FIG. 8A is improved further. In FIG. 8A, a close adhesion of laminating frame 40 to the first resin layer (a) is important for obtaining the airtight sealing. In FIG. 8B, a metalized layer 41 is formed on the upper face of laminating frame 40. This metalized layer 41 is formed by printing tungsten using a squeegee and then burning. After metalized layer 41 is formed, the first resin layer (a) is heated so as to become fluid. At this time, a degree of adhesion of the first resin layer (a) to laminating frame 40 becomes improved by metalized layer 41, enabling higher reliability.

Figure 8C:
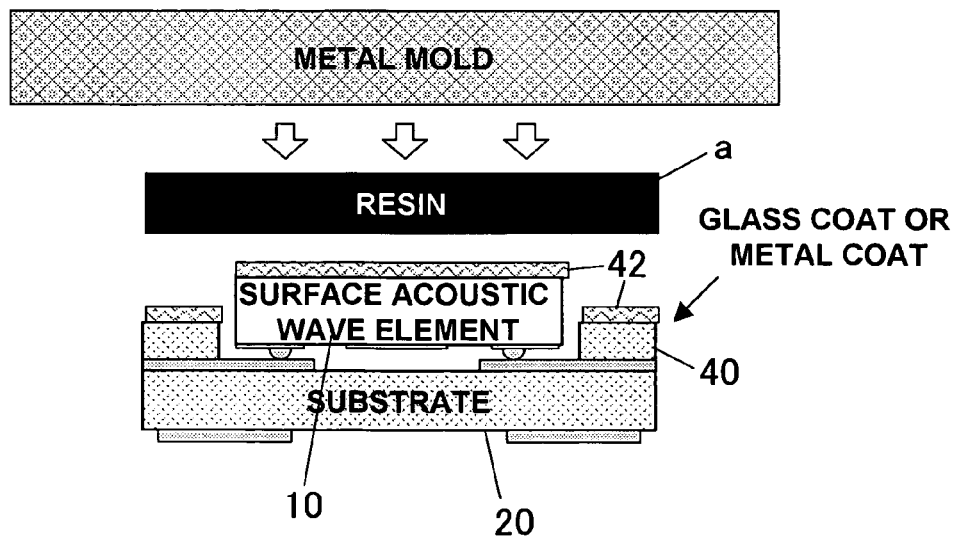

FIG. 8C is a diagram illustrating still another method. According to this embodiment, on both the upper face of surface acoustic wave element 10 and the upper face of laminating frame 40, a glass coat/metal coat 42 is formed. The glass coat can be formed by spatter evaporation of $SiO_2$, and the metal coat can be formed by fixing titanium.

In the embodiment shown in FIG. 8C, especially the glass coat enhances adhesion to the first resin layer (a) enabling enhanced moisture resistance.

INDUSTRIAL APPLICABILITY

As the embodiments of the present invention have been described, according to the present invention, heating process can be shortened, and accordingly, heat break of a surface acoustic wave element can be prevented. Also, a surface acoustic wave device having a thinner profile can be provided.

The foregoing description of the embodiments is not intended to limit the invention to the particular details of the examples illustrated. Any suitable modification and equivalents may be resorted to the scope of the invention. All features and advantages of the invention which fall within the scope of the invention are covered by the appended claims.

What is claimed is:

1. A surface acoustic wave device comprising:
   a substrate;
   a surface acoustic wave element having a comb electrode formed on a piezoelectric substrate, and being flip-mounted on the substrate using a bump in such a manner as the comb electrode is disposed opposite to the substrate;
   a first resin layer covering the surface acoustic wave element; and
   a second resin layer formed on the first resin layer,
   wherein the first resin layer and the second resin layer are thermosetting resins in which state transitions of being softened and thereafter cured are produced through heating process, and
   the first resin layer is formed of a resin material having greater fluidity caused by softening than the resin material of the second resin layer,
   wherein the second resin layer includes a mold releasing agent added thereto, and the second resin layer is separated from the first resin layer after the state transitions in the first resin layer of being softened and thereafter cured are produced.

2. The surface acoustic wave device according to claim 1, wherein the first resin layer is constituted of a resin material having a higher curing temperature than the resin material of the second resin layer.

3. A surface acoustic wave device comprising:
   a substrate;
   a surface acoustic wave element having a comb electrode formed on a piezoelectric substrate, and being flip-mounted on the substrate using a bump in such a manner as the comb electrode is disposed opposite to the substrate;
   a heat-resistant laminating frame laminated on the substrate, and positioned so as to surround the surface acoustic wave element, wherein a height of the heat-resistant laminating frame is lower than a height of the surface acoustic wave element disposed opposite the substrate; and
   a resin layer for covering the surface acoustic wave element,
   wherein the resin layer is a thermosetting resin in which state transitions of being softened and thereafter cured are produced through heating process, and
   the resin layer seals the comb electrode by adhering to the side faces of the surface acoustic wave element and the upper face of the laminating frame.

4. The surface acoustic wave device according to claim 3, wherein at least a portion of the upper face of the laminating frame is metalized.

5. The surface acoustic wave device according to claim 3, wherein either a glass coat or a metal coat is formed on the upper face of the laminating frame and the upper face of the surface acoustic wave element.

* * * * *